United States Patent
Torimi et al.

(10) Patent No.: US 9,570,306 B2
(45) Date of Patent: Feb. 14, 2017

(54) SURFACE TREATMENT METHOD FOR SINGLE CRYSTAL SIC SUBSTRATE, AND SINGLE CRYSTAL SIC SUBSTRATE

(71) Applicant: TOYO TANSO CO., LTD., Osaka-shi, Osaka (JP)

(72) Inventors: Satoshi Torimi, Kanonji (JP); Norihito Yabuki, Kanonji (JP); Satoru Nogami, Kanonji (JP)

(73) Assignee: TOYO TANSO CO., LTD., Osaka-shi (JP)

( * ) Notice: Subject to any disclaimer, the term of this patent is extended or adjusted under 35 U.S.C. 154(b) by 0 days.

(21) Appl. No.: 14/435,383

(22) PCT Filed: Nov. 15, 2013

(86) PCT No.: PCT/JP2013/006720
§ 371 (c)(1),
(2) Date: Apr. 13, 2015

(87) PCT Pub. No.: WO2014/076963
PCT Pub. Date: May 22, 2014

(65) Prior Publication Data
US 2015/0294867 A1 Oct. 15, 2015

(30) Foreign Application Priority Data

Nov. 16, 2012 (JP) .................................. 2012-252753
Jun. 13, 2013 (JP) .................................. 2013-125016

(51) Int. Cl.
*H01L 21/04* (2006.01)
*C30B 29/36* (2006.01)
(Continued)

(52) U.S. Cl.
CPC ........... *H01L 21/0445* (2013.01); *C30B 29/36* (2013.01); *C30B 31/22* (2013.01); *C30B 33/02* (2013.01);
(Continued)

(58) Field of Classification Search
CPC .. H01L 21/0445; H01L 21/3065; C30B 29/36; C30B 31/22; C30B 33/08; C30B 33/12
See application file for complete search history.

(56) References Cited

U.S. PATENT DOCUMENTS 5,268,200 A * 12/1993 Steger ............... H01J 37/32495
216/37
2008/0293240 A1* 11/2008 Kawada ............. H01L 21/0475
438/652

FOREIGN PATENT DOCUMENTS

JP 2003-234313 A 8/2003
JP 2008-230944 A 10/2008
(Continued)

OTHER PUBLICATIONS

International Search Report dated Jan. 28, 2014 issued in corresponding application No. PCT/JP2013/006720.
(Continued)

*Primary Examiner* — Duy Deo
(74) *Attorney, Agent, or Firm* — Westerman, Hattori, Daniels & Adrian, LLP

(57) ABSTRACT

The present application aims to provide a surface treatment method that is able to accurately control the rate of etching a single crystal SiC substrate and thereby enables correct understanding of the amount of etching. In the surface treatment method, the single crystal SiC substrate is etched by a heat treatment performed under Si vapor pressure. At a time of the etching, inert gas pressure in an atmosphere around the single crystal SiC substrate is adjusted to control
(Continued)

the rate of etching. Accordingly, correct understanding of the amount of etching is obtained.

12 Claims, 9 Drawing Sheets

(51) Int. Cl.
    *C30B 33/12*     (2006.01)
    *C30B 31/22*     (2006.01)
    *H01L 21/3065*     (2006.01)
    *C30B 33/02*     (2006.01)
    *C30B 33/08*     (2006.01)
    *H01L 29/16*     (2006.01)

(52) U.S. Cl.
    CPC ............... *C30B 33/08* (2013.01); *C30B 33/12* (2013.01); *H01L 21/3065* (2013.01); *H01L 29/1608* (2013.01)

(56) References Cited

FOREIGN PATENT DOCUMENTS

JP     2010-265126 A     11/2010
JP     2011-233780 A     11/2011
JP     2012-209415 A     10/2012

OTHER PUBLICATIONS

Office Action dated Jan. 29, 2016, issued in counterpart Japanese Application No. 2012-252753, with machine translation (10 pages).
T. Nishiguchi, et al.: "Thermal Etching of 6H-SiC Substrate Surface", Japanese Journal of Applied Physics, Japan Society of Applied Physics, vol. 42, No. 4A, Part 01, Apr. 1, 2003, pp. 1533-1537.
Extended (supplementary) European Search Report dated Jul. 27, 2016, issued in counterpart European Patent Application No. 13854743.5. (9 pages).
Office Action dated Nov. 4, 2016, issued in counterpart Japanese Application No. 2013-125016, with machine translation. (8 pages).
Office Action dated Oct. 17, 2016, issued in counterpart Chinese Application No. 201380059807.6, with English translation. (8 pages).

\* cited by examiner

Fig.2
(a) FORMING EPITAXIAL LAYER
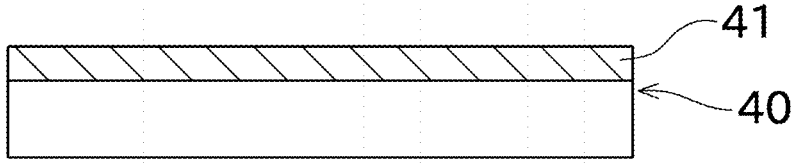
(b) IMPLANTING IONS
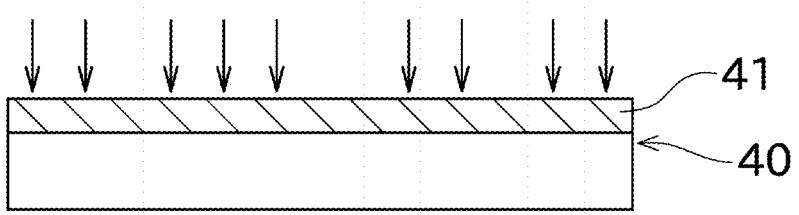
(c) AFTER ION IMPLANTATION
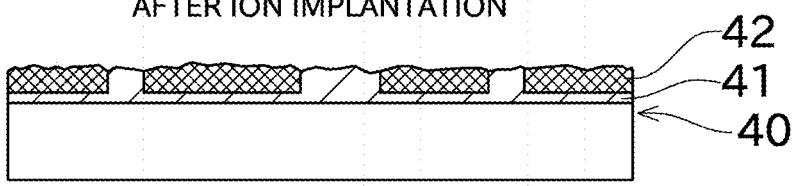
(d) DURING ETCHING
(ION ACTIVATION, OCCURRENCE OF MACRO-STEP BUNCHING)
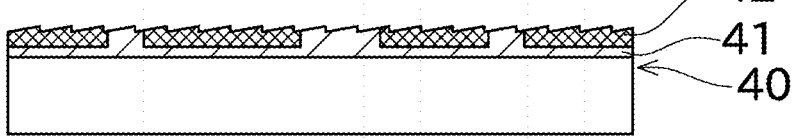
(e) AFTER ETCHING
(ETCHING OF INSUFFICIENT ION-IMPLANTED PORTION IS COMPLETED)
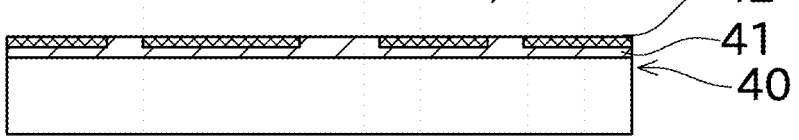

Fig.6
(a) 4H-SiC(0001)FACE (Si-FACE)
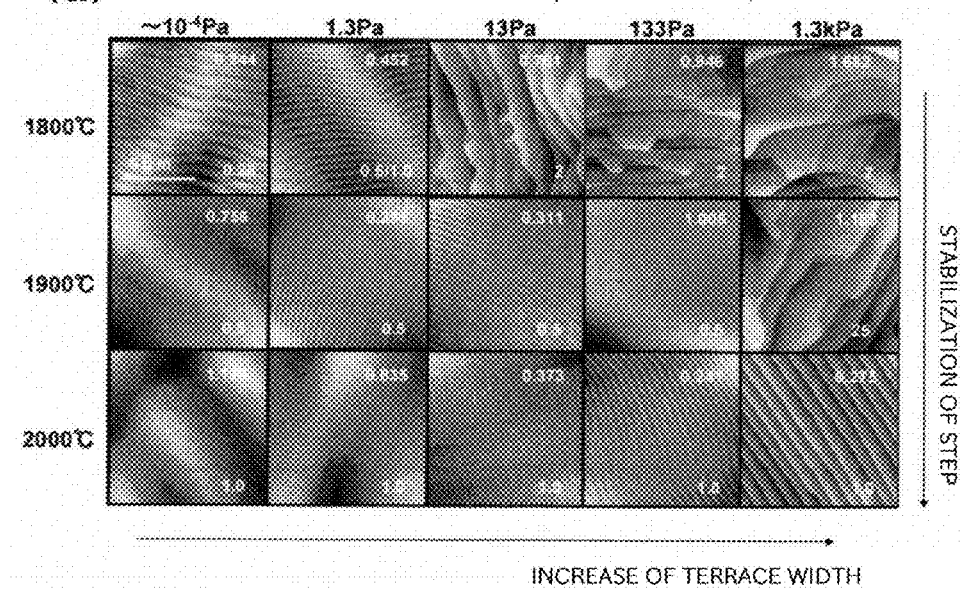
(b) 4H-SiC(000-1)FACE (C-FACE)
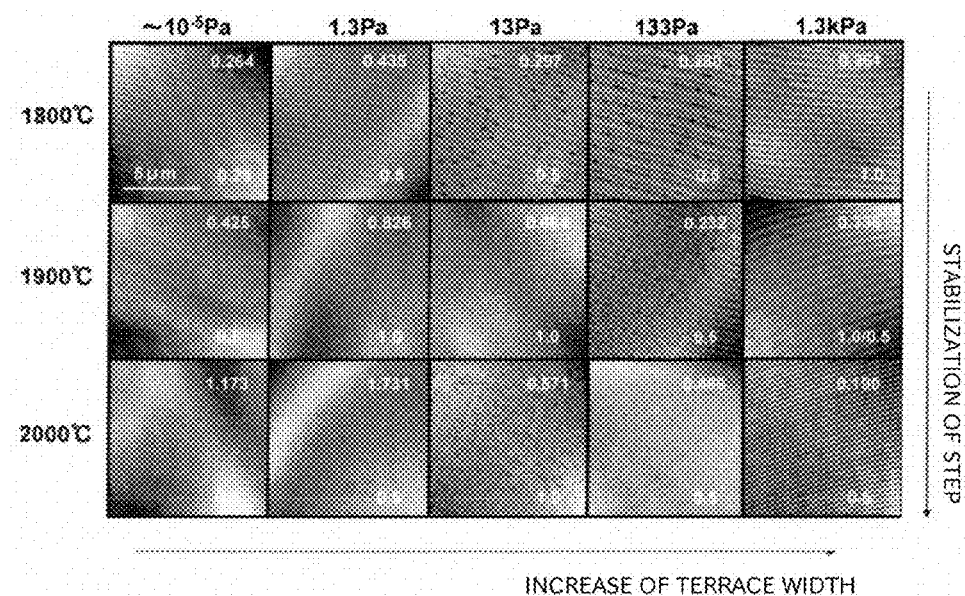

Fig.9
(a)
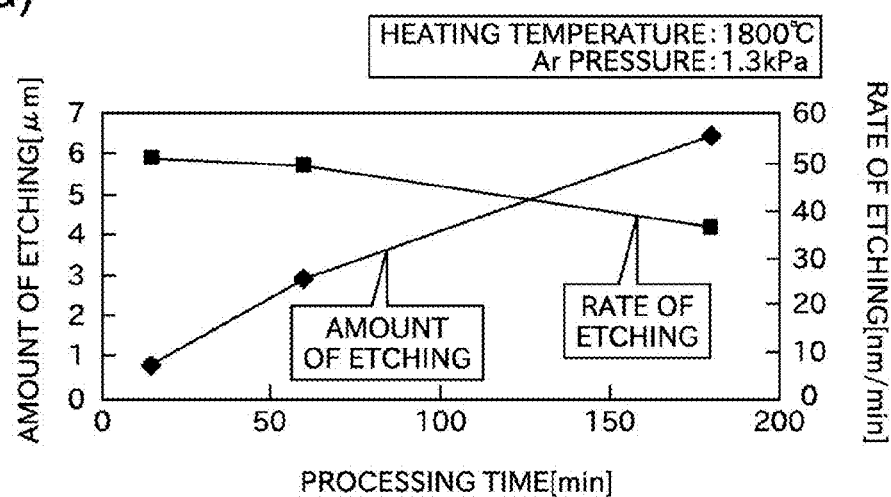
(b)
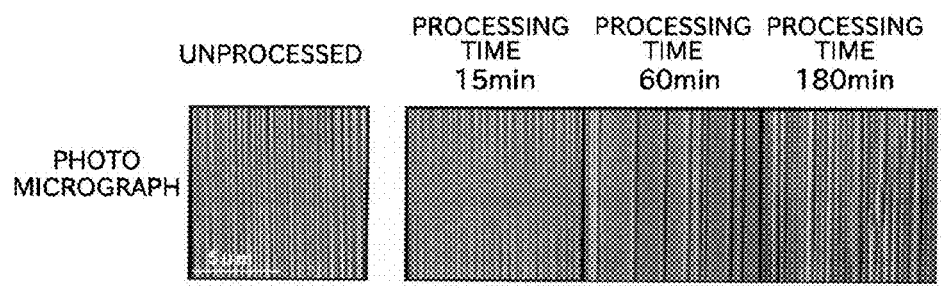

SURFACE TREATMENT METHOD FOR SINGLE CRYSTAL SIC SUBSTRATE, AND SINGLE CRYSTAL SIC SUBSTRATE

TECHNICAL FIELD

The present invention relates mainly to a method for accurately controlling the rate of etching a surface of a single crystal SiC substrate.

BACKGROUND ART

SiC, which is superior to Si, etc., in terms of heat resistance, mechanical strength, and the like, has been attracting attention as a new semiconductor material. Some single crystal SiC substrate may originally contain, in its surface, crystal defects or the like.

Patent Document 1 discloses a surface planarization method for planarizing (repairing) a surface of a single crystal SiC substrate. The surface planarization method includes forming a carbonized layer and a sacrificial growth layer on a single crystal SiC substrate, and etching the sacrificial growth layer, for surface planarization. This can produce a high-quality seed substrate for epitaxial growth. Patent Document 1 discloses performing etching under a high-vacuum condition.

In general, a seed crystal produced in the above-described manner is subjected to treatments including epitaxial growth, ion implantation, ion activation, and the like.

Patent Document 2 discloses a method for suppressing sublimation of Si and SiC during ion activation, by performing the ion activation after a carbon layer (graphene cap) is formed on a surface of a single crystal SiC substrate. In the method, subsequently, the carbon layer is removed, and the surface of the single crystal SiC substrate is etched to remove an insufficient ion-implanted portion.

The etching is performed for the purpose of removing a portion (insufficient ion-implanted portion) of the surface of the single crystal SiC substrate where the ion concentration is insufficient. Patent Document 2 discloses a technique of controlling the rate of etching by adjusting the temperature and Si vapor pressure.

PRIOR-ART DOCUMENTS

Patent Documents

Patent Document 1: Japanese Patent Application Laid-Open No. 2008-230944
Patent Document 2: Japanese Patent Application Laid-Open No. 2011-233780

SUMMARY OF THE INVENTION

Problems to be Solved by the Invention

The disclosure of Patent Document 1 does not go beyond performing the etching under a high-vacuum condition, and does not describe a control of the rate of etching.

Patent Document 2 requires that, for example, a storing container be adjusted or replaced before each etching, in order to adjust the Si vapor pressure. Therefore, cumbersome procedures are needed. In addition, in a case of changing a gap of the storing container, the Si vapor pressure is changed by even a very small error. It is therefore difficult to ensure achievement of a predetermined vapor pressure.

Moreover, Patent Document 2 needs a step of forming a carbon layer and a step of removing the carbon layer, which results in a complicated process.

Furthermore, if a heat treatment including ion activation and the like is performed on a substrate having an off angle, macro-step bunching occurs. Here, the macro-step bunching means a phenomenon in which a plurality of SiC layers form a bunch of steps having a height of one nm or more (or means the steps composed of the plurality of SiC layers).

Occurrence of the macro-step bunching may make the device structure of a semiconductor device unstable, or may cause a local concentration of an electric field to degrade the performance of the semiconductor device. Therefore, the heat treatment has been conventionally performed in a high-vacuum Si atmosphere, to remove the macro-step bunching.

Performing the heat treatment in a high-vacuum Si atmosphere, however, may cause too much removal of the substrate because the rate of etching is high. Particularly in a case of removing an ion-implanted substrate, an ion implanted portion may be removed to a large extent. From this viewpoint as well, a configuration capable of an accurate control of the rate of etching has been demanded.

The present invention has been made in view of the circumstances described above, and a primary object of the present invention is to provide a surface treatment method that is able to accurately control the rate of etching a single crystal SiC substrate and thereby enables correct understanding of the amount of etching.

Means for Solving the Problems and Effects Thereof

Problems to be solved by the present invention are as described above, and next, means for solving the problems and effects thereof will be described.

In an aspect of the present invention, a surface treatment method is provided in which a single crystal SiC substrate is etched by being subjected to a heat treatment under Si vapor pressure. The method includes an etching step of controlling the rate of etching by adjusting inert gas pressure of an atmosphere around the single crystal SiC substrate. The rate of etching is 1000 nm/min or less.

This enables an accurate control of the rate of etching. Therefore, a required amount of etching of the single crystal SiC substrate can be obtained. In particular, what is needed is only adjusting the inert gas pressure. This provides an easier control of the rate of etching, as compared with adjusting Si pressure. More preferably, the single crystal SiC substrate is stored in a crucible when being treated, and the crucible is made of tantalum metal and includes a tantalum carbide layer that is exposed to an internal space of the crucible.

Preferably, the surface treatment method for treating the surface of the single crystal SiC substrate is as follows. The method includes an ion implantation step of implanting ions in the single crystal SiC substrate. In the etching step, an insufficient ion-implanted portion of the surface of the single crystal SiC substrate is removed.

Accordingly, the present invention provides an accurate control of the rate of etching, so that only the insufficient ion-implanted portion can be etched correctly.

In the surface treatment method for treating the surface of the single crystal SiC substrate, it is preferable that, in the etching step, the ions implanted in the single crystal SiC substrate are activated while the insufficient ion-implanted portion is removed.

This enables two steps to be implemented in one process, which can simplify the process.

In the surface treatment method for treating the surface of the single crystal SiC substrate, it is preferable that the etching step is performed on the single crystal SiC substrate whose surface is exposed without being covered with any carbon layer.

Since there is no need to performs the steps of forming a carbon layer and removing the carbon layer, further simplification of the process is achieved.

In the surface treatment method for treating the surface of the single crystal SiC substrate, it is preferable that the rate of etching is 100 nm/min or less.

Accordingly, the present invention achieves a rate of etching of 100 nm/min, which is lower than the conventional rate, by adjusting the inert gas pressure. This enables correct understanding of the amount of etching. This also enables the shape of the surface of the single crystal SiC substrate to be maintained in the etching.

In the surface treatment method for treating the surface of the single crystal SiC substrate, it is preferable that the etching step is performed on the single crystal SiC substrate before an epitaxial layer is formed thereon.

Accordingly, the surface of the single crystal SiC substrate before an epitaxial layer is formed thereon can be planarized with an accurate control of the rate of etching.

In the surface treatment method for treating the surface of the single crystal SiC substrate, it is preferable that the inert gas pressure is 10 Pa or more.

Setting the inert gas pressure to the above-mentioned range enables an accurate control of the rate of etching.

In another aspect of the present invention, a surface treatment method for treating a surface of a single crystal SiC substrate is provided in which the single crystal SiC substrate is etched by performing a heat treatment under Si vapor pressure. The method includes an etching step of controlling the rate of etching by adjusting inert gas pressure of an atmosphere around the single crystal SiC substrate. The single crystal SiC substrate has an off angle relative to a (0001) face. In the etching step, the heat treatment is performed on the single crystal SiC substrate in an atmosphere of an inert gas and Si, to remove macro-step bunching formed during the treatment performed on the surface of the single crystal SiC substrate.

Since the macro-step bunching is removed, the qualities of the single crystal SiC substrate and a semiconductor device including the same are improved. In addition, use of the inert gas pressure to control the rate of etching leads to suppression of the rate of etching. This can prevent too much removal of the surface of the single crystal SiC substrate.

In the surface treatment method for treating the surface of the single crystal SiC substrate, it is preferable that the inert gas pressure is adjusted so as to set the rate of etching to 100 nm/min or more (and preferabley 1000 nm/min or less).

When the rate of etching is about 100 nm/min or less, the macro-step bunching cannot be removed. Performing the above-described control ensures the removal of the macro-step bunching.

In the surface treatment method for treating the surface of the single crystal SiC substrate, it is preferable that the inert gas pressure is adjusted in consideration of a heating temperature at a time of removal of the macro-step bunching.

Accordingly, the rate of etching depends on the heating temperature, too. Thus, by performing the above-described control, the macro-step bunching can be surely removed while too much removal of the surface of the single crystal SiC substrate can be prevented.

In the surface treatment method for treating the surface of the single crystal SiC substrate, it is preferable that the inert gas pressure at a time of removal of the macro-step bunching is, at least temporarily, set to 0.5 Pa or more and 10 Pa or less.

Accordingly, the rate of etching can be set to 100 nm/min or more, and therefore the removal of the macro-step bunching is ensured.

Preferably, the surface treatment method for treating the surface of the single crystal SiC substrate is as follows. The method includes an ion implantation step of implanting ions in the single crystal SiC substrate. An insufficient ion-implanted portion of the surface of the single crystal SiC substrate and the macro-step bunching are removed simultaneously.

Since the insufficient ion-implanted portion and the macro-step bunching can be removed simultaneously, an efficient surface treatment is achieved. In the present application, the rate of etching can be suppressed, and therefore too much removal of a portion where the ions are implanted is prevented.

BRIEF DESCRIPTION OF THE DRAWINGS

FIG. 2 Diagrams each schematically showing the appearance of a substrate in each step.

FIG. 6 Photomicrographs each showing the appearance of Si-face or C-face of 4H—SiC under each condition.

FIG. 9 (a) is a graph showing the relationship of the amount of etching and the rate of etching relative to a processing time; and (b) shows photomicrographs of substrate surfaces that were etched for different processing times.

EMBODIMENT FOR CARRYING OUT THE INVENTION

Next, an embodiment of the present invention will be described with reference to the drawings.

Figure 1:
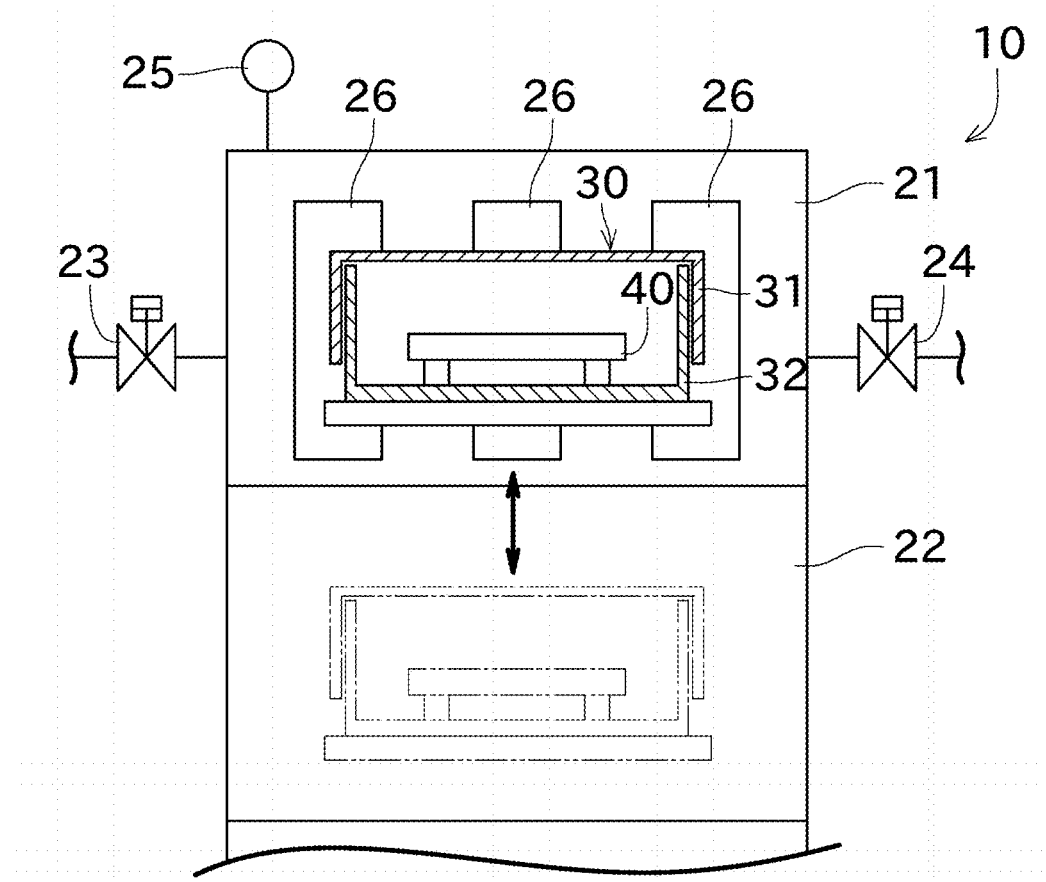
FIG. 1 A diagram for illustration of an outline of a high-temperature vacuum furnace for use in a surface treatment method according to the present invention.

Firstly, a high-temperature vacuum furnace 10 that is used in a heat treatment of this embodiment will be described with reference to FIG. 1. FIG. 1 is a diagram for illustration of an outline of a high-temperature vacuum furnace for use in a surface treatment method according to the present invention.

As shown in FIG. 1, the high-temperature vacuum furnace 10 includes a main heating chamber 21 and a preheating chamber 22. The main heating chamber 21 is able to heat a single crystal SiC substrate to a temperature of 1000° C. or more and 2300° C. or less. The preheating chamber 22 defines a space for preheating a single crystal SiC substrate before it is heated in the main heating chamber 21.

A vacuum application valve 23, an inert gas feed valve 24, and a vacuum meter 25 are connected to the main heating chamber 21. The vacuum application valve 23 is able to adjust the degree of vacuum in the main heating chamber 21. The inert gas feed valve 24 is able to adjust the pressure of an inert gas (for example, Ar gas) in the main heating chamber 21. The vacuum meter 25 is able to measure the degree of vacuum in the main heating chamber 21.

A heater 26 is provided in the main heating chamber 21. A heat reflection metal plate (not shown) is fixed to a sidewall and a ceiling of the main heating chamber 21. The heat reflection metal plate is configured to reflect heat of the heater 26 toward a central area of the main heating chamber 21. This is able to strongly and uniformly heat the single crystal SiC substrate and raise its temperature up to 1000° C. or more and 2300° C. or less. For example, a heater of resistive heating type or a heater of high-frequency induction type is adoptable as the heater 26.

The single crystal SiC substrate is heated while stored in a crucible (storing container) 30. The crucible 30 is placed on an appropriate support or the like, and the support is movable at least in a range from the preheating chamber to the main heating chamber.

The crucible 30 includes an upper container 31 and a lower container 32 that are fittable with each other. The crucible 30 is made of tantalum metal, and includes a tantalum carbide layer that is exposed to an internal space of the crucible 2.

To perform a heat treatment on the single crystal SiC substrate, as indicated by a chain line in FIG. 1, the crucible 30 is placed in the preheating chamber 22 of the high-temperature vacuum furnace 10, and preheated at a proper temperature (for example, about 800° C.). Then, the crucible 30 is moved into the main heating chamber 21 in which the temperature has been preliminarily raised to a set temperature (for example, about 1800° C.), and the single crystal SiC substrate is heated.

Figure 3:
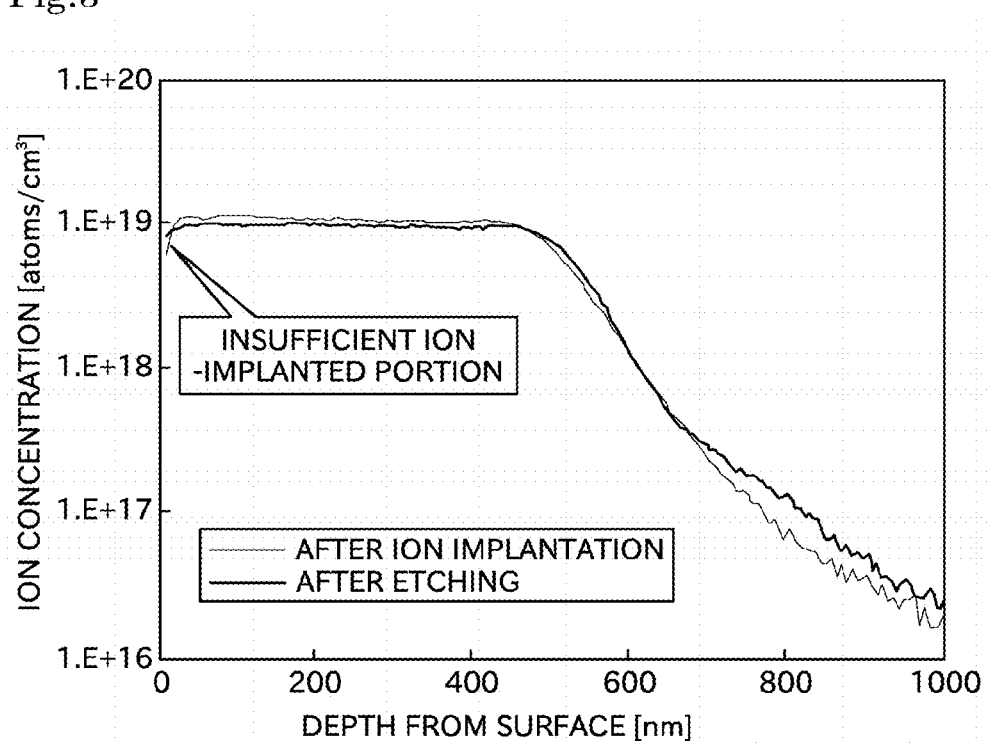
FIG. 3 A graph showing that an insufficient ion-implanted portion is removed by etching.

Next, a process of manufacturing a semiconductor device from a single crystal SiC substrate 40 by using the above-described high-temperature vacuum furnace 10 will be described with reference to FIGS. 2 and 3. FIG. 2 contains diagrams each schematically showing the appearance of a substrate in each step. FIG. 3 is a graph showing that an insufficient ion-implanted portion is removed by etching. Although this embodiment adopts an off-angled substrate as the single crystal SiC substrate 40, the same process can be performed on an on-axis substrate (a substrate obtained by horizontally cutting an ingot), too.

Firstly, as shown in FIG. 2(a), an epitaxial layer 41 is formed on the single crystal SiC substrate 40. Any method is adoptable for forming the epitaxial layer. For example, the known vapor phase epitaxy or metastable solvent epitaxy is adoptable. Since the single crystal SiC substrate 40 is an off-angled substrate, the CVD process that forms an epitaxial layer based on a step-flow control is also adoptable.

Then, as shown in FIG. 2(b), the single crystal SiC substrate 40 having the epitaxial layer 41 formed thereon is implanted with ions. This ion implantation is performed with an ion-doping apparatus having a function of irradiating an object with ions. The ion-doping apparatus selectively implants ions in the whole or a part of the surface of the epitaxial layer 41. A desired region of a semiconductor device is formed based on an ion-implanted portion 42 where ions are implanted.

As a result of the ion implantation, the surface of the epitaxial layer 41 including the ion-implanted portions 42 is roughened (the surface of the single crystal SiC substrate 40 is damaged so that the degree of planarity deteriorates), as shown in FIG. 2(c).

Then, a treatment for activating the implanted ions is performed. In this treatment, the single crystal SiC substrate 40 is heated under Si vapor pressure in an environment of 1500° C. or more and 2200° C. or less, and desirably 1600° C. or more and 2000° C. or less. Thereby, activation of the implant ions is obtained.

Since the single crystal SiC substrate 40 used in this embodiment has an off angle, macro-step bunching is caused by the heat treatment (see FIG. 2(d)). Occurrence of the macro-step bunching may make the device structure of a semiconductor device unstable, or may cause a local concentration of an electric field to degrade the performance of the semiconductor device, as mentioned above. In this respect, this embodiment is able to remove the macro-step bunching by the following etching process.

The macro-step bunching is, though depending on conditions, formed to a depth of about 100 nm from the surface of the single crystal SiC substrate 40. As shown in FIG. 3, a portion (insufficient ion-implanted portion) having an insufficient ion concentration of implanted ions appears at a depth of about several tens of nm from the surface of the single crystal SiC substrate 40. Etching the single crystal SiC substrate 40 too much is not preferable, because it removes a portion having a sufficient ion concentration. In consideration of the above, this embodiment needs to remove the surface of the single crystal SiC substrate 40 to a depth of about 100 nm. A specific description will be given below.

In an etching step, the etching is performed by heating the single crystal SiC substrate 40 under Si vapor pressure. Conventionally, the rate of etching has been high and therefore it has been difficult that only the insufficient ion-implanted portion and the macro-step bunching are accurately removed.

Patent Document 2 discloses controlling the rate of etching by adjusting Si vapor pressure and the like. In order to adjust the Si vapor pressure, however, it is necessary to, for example, change the configuration of a crucible. This requires cumbersome procedures.

In this respect, this embodiment is able to correctly and easily control the rate of etching by adjusting inert gas pressure. Since controlling the rate of etching leads to correct understanding of the amount of etching, only the insufficient ion-implanted portion and the macro-step bunching can be removed by etching. In a case of an on-axis substrate, no macro-step bunching is caused, and therefore only the insufficient ion-implanted portion can be removed by etching.

Figure 4:
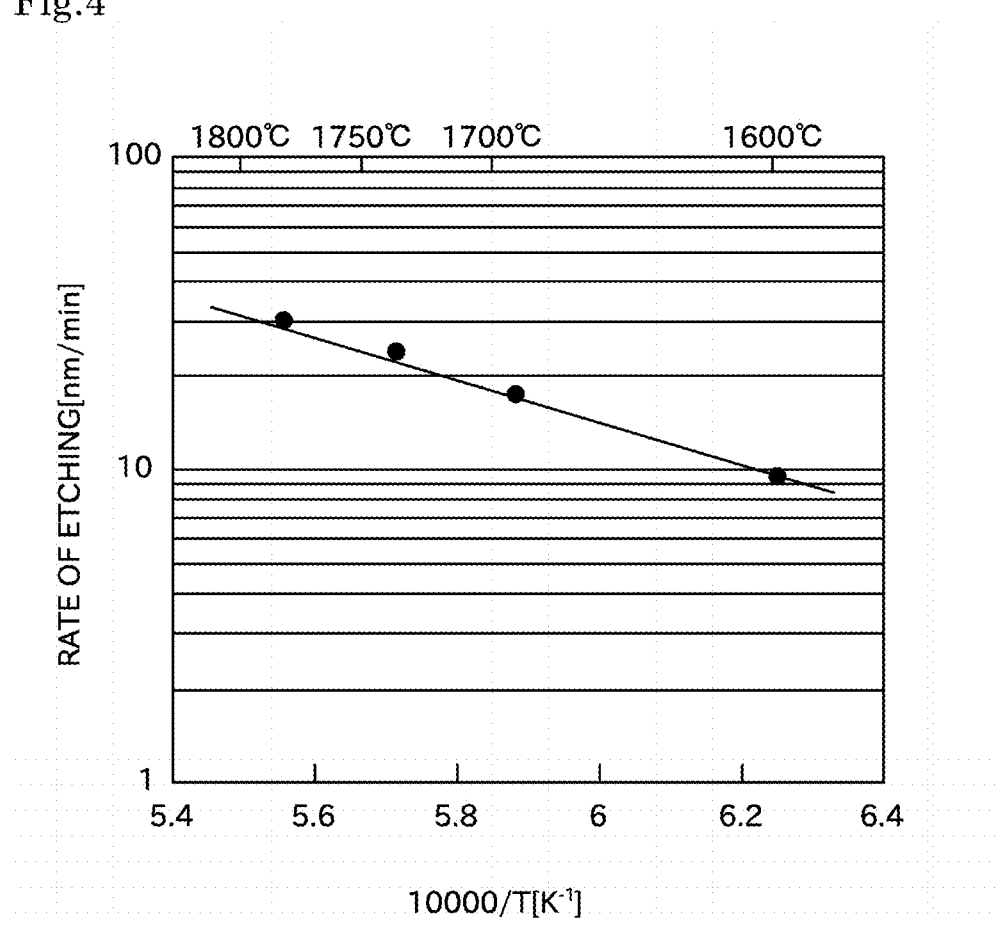
FIG. 4 A graph showing the relationship between the heating temperature and the rate of etching.

Hereinafter, the relationship between the inert gas pressure and the rate of etching, and the like, will be described with reference to FIGS. 4 to 6.

As conventionally known, the rate of etching a single crystal SiC substrate depends on a heating temperature. FIG. 4 is a graph showing the rate of etching under a predetermined environment in cases where the heating temperature was set to 1600° C., 1700° C., 1750° C., and 1800° C. The horizontal axis of the graph represents the reciprocal of the temperature, and the vertical axis of the graph logarithmically represents the rate of etching. As shown in FIG. 4, the graph is linear. This makes it possible to, for example, estimate the rate of etching that will be obtained if the temperature is changed.

Figure 5:
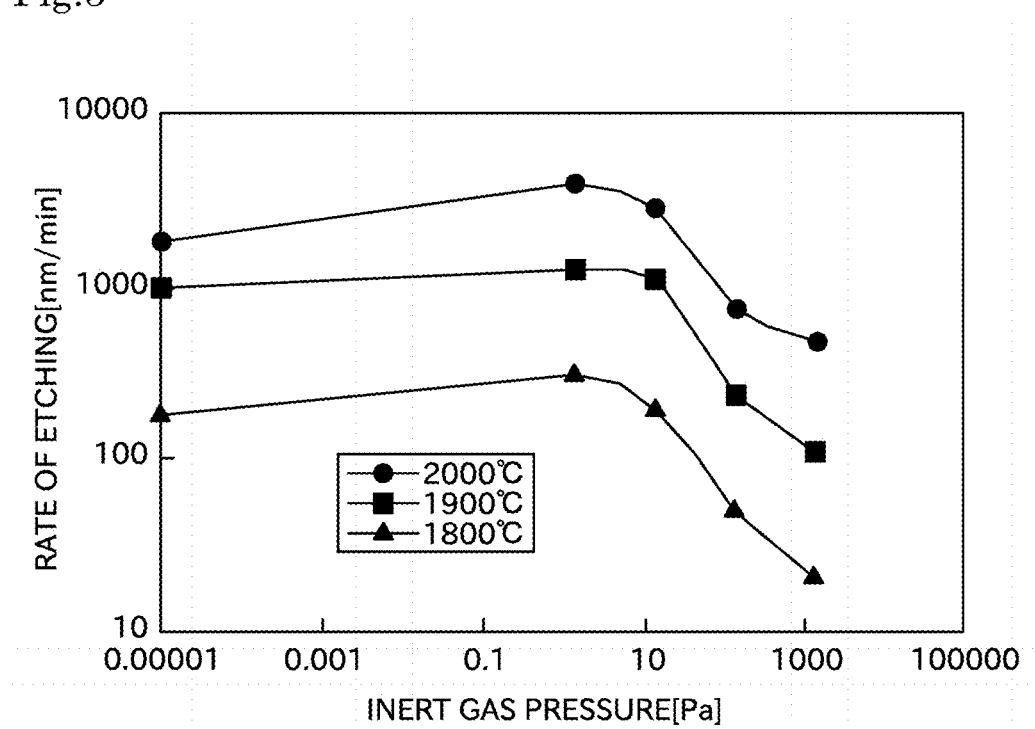
FIG. 5 A graph showing the relationship between the inert gas pressure and the rate of etching for each of heating temperatures.

FIG. 5 is a graph showing the relationship between the inert gas pressure and the rate of etching for an on-axis substrate. More specifically, a change in the rate of etching caused when the inert gas pressure is changed from 0.00001 Pa to about 1000 Pa is shown for each of different heating temperatures. Although the graph of FIG. 5 relates to a Si-face of the on-axis substrate, experiments conducted by the applicants have revealed that the same relationship is obtained in a C-face of the on-axis substrate as well.

Conventionally, etching has been performed under a high-vacuum condition, and therefore the rate of etching is relatively high, which makes it difficult to obtain correct understanding of the amount of etching. In this respect, this embodiment is able to lower the rate of etching by setting the inert gas pressure high. Particularly in a range of several hundreds of Pa to about 1000 Pa at a heating temperature of 1800° C., a low rate of etching of 100 nm/min or less can be achieved. A low rate of etching, which enables correct understanding of the amount of etching, is very effective in a situation where a slight amount of etching is demanded. When the inert gas pressure is 10 Pa or more, the rate of etching can be lowered to 1000 nm/min or less. In this case as well, understanding of the amount of etching can be obtained. As for an off-angled substrate, setting the rate of etching to 100 nm/min or more to remove the macro-step bunching is preferable, as will be described later.

FIG. 6 contains photomicrographs each showing Si-face or C-face of an on-axis substrate, which were obtained under different heating temperatures and different inert gas pressures. In each photomicrograph, the numerical value in the upper right corner indicates the surface roughness (nm), and the numerical value in the lower right corner indicates the height (nm) of a step. In a general trend observed, it can be seen that a higher heating temperature leads to stabilization of the step shape and a higher inert gas pressure leads to increase in the terrace width. It can be also seen that, in the C-face, ideal steps were formed irrespective of the heating temperature and the inert gas pressure.

Figure 7:
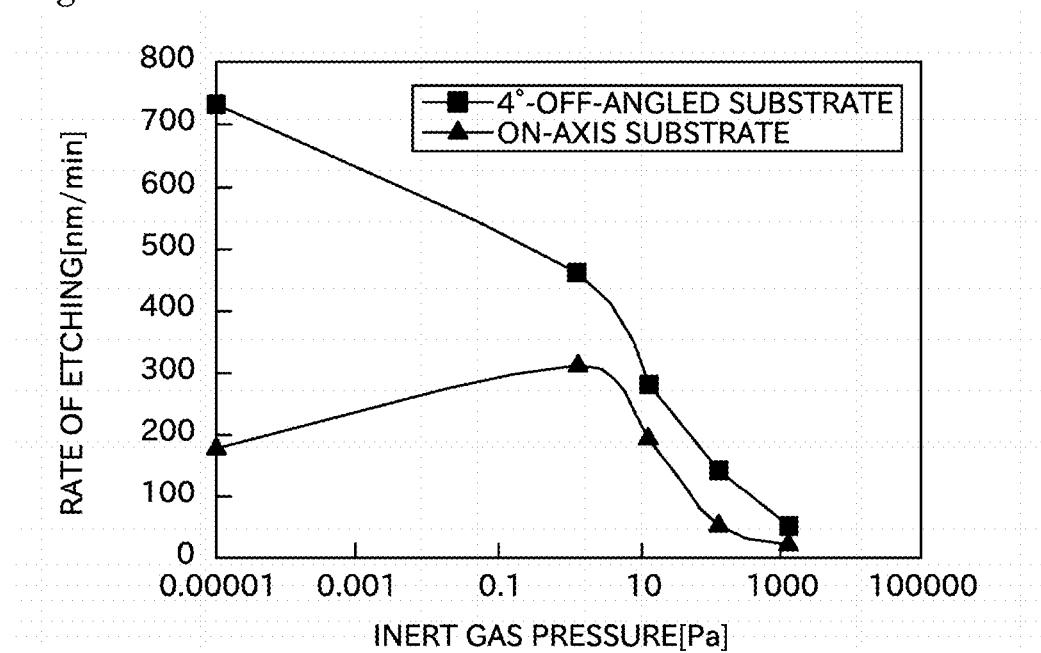
FIG. 7 A graph showing the relationship between the inert gas pressure and the rate of etching in each of an on-axis substrate and a four-degree-off-angled substrate.

The presence of correlation between the inert gas pressure and the rate of etching in an on-axis substrate has been described above. The correlation is present not only in the on-axis substrate but also in an off-angled substrate. FIG. 7 is a graph showing the relationship between the rate of etching and the inert gas pressure in each of an on-axis substrate and an off-angled substrate at a heating temperature of 1800° C. As shown in FIG. 7, the graphs of the on-axis substrate and the off-angled substrate show different behaviors, but have in common that an increase in the inert gas pressure leads to a decrease in the rate of etching. Accordingly, in the off-angled substrate as well, correct understanding of the amount of etching can be obtained by lowering the rate of etching.

When the inert gas pressure is low, the rate of etching the off-angled substrate is relatively high, but it does not exceed 1000 nm/min. Thus, in a case where the heating temperature is 1800° C., the rate of etching does not reach an excessively high value. Therefore, the rate of etching can be controlled properly.

Figure 8:
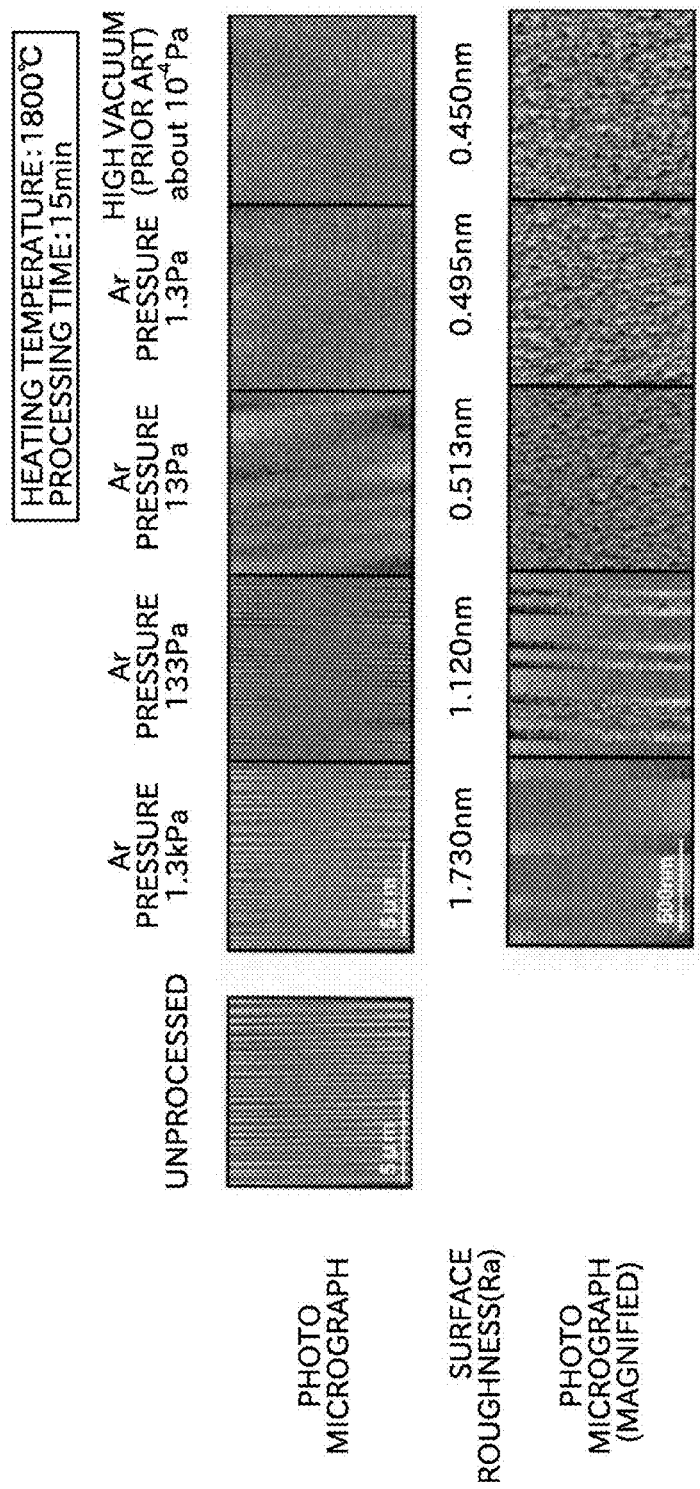
FIG. 8 Photomicrographs of substrate surfaces that were etched under different inert gas pressures, with surface roughnesses thereof.

Next, the relationship between the rate of etching and removal of macro-step bunching will be described. FIG. 8 shows photomicrographs of substrate surfaces that were etched under different inert gas pressures. In FIG. 9, (a) is a graph showing the relationship of the (accumulated) amount of etching and the rate of etching relative to a processing time; and (b) shows photomicrographs of surfaces of the single crystal SiC substrate 40 that were etched for different processing times.

In FIG. 8, the leftmost photomicrograph shows the surface of the single crystal SiC substrate 40 obtained before the etching process is performed. This photomicrograph contains numerous straight lines. The straight lines indicate unevenness of the macro-step bunching. On the right side of the photomicrograph of the unprocessed state, there are photomicrographs each showing the surface, with the surface roughness, of the single crystal SiC substrate 40 obtained after the heating is performed for 15 minutes at 1800° C. under each of different inert gas pressures. Shown below these photomicrographs are photomicrographs magnifying these photomicrographs, respectively.

As shown in these drawings, the macro-step bunching was left under inert gas pressure of 1.3 kPa, and a significant decrease in the surface roughness and partial removal of the macro-step bunching were observed under inert gas pressure of 133 Pa. The surface roughness further decreased so that the macro-step bunching was substantially entirely removed under inert gas pressure of 13 Pa, under inert gas pressure of 1.3 Pa, and under high vacuum.

FIG. 9 shows data obtained when the heating was performed for 15 minutes, 60 minutes, and 180 minutes at 1800° C. under inert gas pressure of 1.3 kPa. As shown in FIG. 9(a), the rate of etching was substantially constant, and therefore the amount of etching increased in proportion to elapse of time. Referring to FIG. 9(b), however, the macro-step bunching was not removed even after 60 minutes or 180 minutes elapsed, which provided a sufficient amount of etching. This reveals that whether or not the macro-step bunching can be removed depends not on the amount of etching but on the rate of etching.

Based on these experimental results, the graph shown in FIG. 7, and the numerical values of the surface roughness shown in FIG. 8, it can be understood that breakdown of the macro-step bunching is started so that partial removal thereof occurs when the rate of etching is 100 nm/min or more, and a further increase in the rate of etching enables the macro-step bunching to be almost entirely removed.

When the rate of etching is too high, excessive removal of the ion-implanted portion may occur. Therefore, a too high rate of etching is not preferable. From the above, in a case of using an off-angled substrate, setting the inert gas pressure to, for example, about 0.5 Pa to 10 Pa is preferable. Since the rate of etching depends not only on the inert gas pressure but also on the heating temperature and the Si pressure, considering them in adjusting the rate of etching is preferable.

In some case, microroughness may remain even after the macro-step bunching is removed, as shown in FIG. 8. If the microroughness raises a problem from the viewpoint of, for example, the performance of the semiconductor device, the following process can be performed: the inert gas pressure is firstly adjusted to set the rate of etching to 100 nm/min or more, then the heat treatment is performed to break down or remove macro-step bunching, and then an inert gas is additionally fed to lower the rate of etching, thus improving the planarity of the surface.

Next, experiments conducted for comparison between the etching according to this embodiment and the etching according to the conventional method, and results of the experiments, will be described.

EXAMPLE 1

Multi-stage implantation of $Al^+$ ions was performed on a single crystal SiC substrate of 4H—SiC, 4°-off (0001), (□10 mm/4"), with an epitaxial layer of n-type $1\times10^{16}/cm^3$ to 10

μm, under conditions of a high temperature (500° C.), 1×10$^{19}$ atoms/cm$^3$, and a depth of 500 nm from the substrate surface. The single crystal SiC substrate obtained as a result of this ion implantation was placed in the above-described crucible having a lid with a diameter of 20 mm, and etching was performed for 5 minutes at 1600° C. under an Ar atmosphere of 1.3 kPa.

COMPARATIVE EXAMPLE 1

A conventional carbon layer was formed on the single crystal SiC substrate obtained as a result of the ion implantation, and annealing (heat treatment) was performed thereon. Then, electrical characteristics were compared against those of the example 1 described above.

The electrical characteristics of the example 1 and the comparative example 1 were measured. After the annealing performed in the comparative example 1, the sheet resistance was 1.35×10$^4$ ohm/square, and the carrier density was 3.47×10$^{17}$/cm$^3$. On the other hand, after the annealing performed in the example 1, the sheet resistance was 3.26×10$^4$ ohm/square, and the carrier density was 3.89×10$^{17}$/cm$^3$. Accordingly, it was confirmed that almost comparable levels of activation were achieved.

A channeling measurement based on an RBS (Rutherford backscattering) measurement was performed on the surfaces of the single crystal SiC substrates used in the comparative example 1 and the example 1, which were obtained immediately after the epitaxial growth and immediately after the ion implantation, to measure the $\chi_{min}$ value. The resulting value was 2.0% immediately after the epitaxial growth, and 7.8% immediately after the ion implantation. In the example 1, the value was 2.5%, and in the comparative example 1, the value was 2.4%. Thus, in terms of recovery of crystallinity, an effect equivalent to the effect of the conventional configuration having a carbon layer is obtained.

As thus far described, this embodiment provides a surface treatment method in which a heat treatment is performed under Si vapor pressure for etching. The rate of etching is controlled by adjusting the inert gas pressure in an atmosphere around the single crystal SiC substrate 40.

This enables an accurate control of the rate of etching. Therefore, a required amount of etching of the single crystal SiC substrate 40 can be obtained. In particular, what is needed is only adjusting the inert gas pressure. This provides an easier control of the rate of etching, as compared with adjusting Si pressure.

The surface treatment method of this embodiment includes an ion implantation step of implanting ions in the single crystal SiC substrate 40. In the above-described etching, the insufficient ion-implanted portion existing on the surface of the single crystal SiC substrate 40 is removed.

Accordingly, this embodiment is capable of accurate control of the rate of etching, so that only the insufficient ion-implanted portion can be etched correctly.

In the surface treatment method of this embodiment, the ions implanted in the single crystal SiC substrate 40 are activated and the insufficient ion-implanted portion is removed in the etching.

This enables two steps to be implemented in one process, which can simplify the process.

In the surface treatment method of this embodiment, a step of forming a carbon layer is not performed, and the etching is performed on the single crystal SiC substrate 40 whose surface is exposed.

Since there is no need to perform the steps of forming a carbon layer and removing the carbon layer, further simplification of the process is achieved.

In the surface treatment method of this embodiment, the single crystal SiC substrate 40 having an off angle is subjected to a heat treatment in an atmosphere of an inert gas and Si, to remove macro-step bunching formed during the surface treatment performed on the single crystal SiC substrate 40.

Since the macro-step bunching is removed, the qualities of the single crystal SiC substrate 40 and the semiconductor device including the same are improved. In addition, use of the inert gas pressure to control the rate of etching leads to suppression of the rate of etching. This can prevent too much removal of the surface of the single crystal SiC substrate 40.

In the surface treatment method of this embodiment, the inert gas pressure is adjusted in consideration of the heating temperature at a time of removal of the macro-step bunching.

Accordingly, the rate of etching depends on the heating temperature, too. Thus, by performing the above-described control, the macro-step bunching can be surely removed while too much removal of the surface of the single crystal SiC substrate 40 can be prevented.

Although a preferred embodiment of the present invention has been described above, the above-described configuration can be modified, for example, as follows.

In this embodiment, the control of the rate of etching by using the inert gas pressure is applied to the etching process performed after ion implantation, but the above-described control is applicable to various types of processes as long as the process requires an accuracy in the amount of etching.

For example, forming a carbonized layer and a sacrificial growth layer and then etching the sacrificial growth layer, as disclosed in Patent Document 1, is known as a method for planarizing a substrate (substrate containing crystal defects and the like) before an epitaxial growth. It is preferable that the sacrificial growth layer is completely removed. Use of the above-described control is able to ensure the removal of the sacrificial growth layer.

Although the above-described embodiment does not include the step of forming a carbon layer (graphene cap), it is acceptable to perform this step. In such a case, the step of removing the carbon layer, the step of activating ions, and the step of etching the single crystal SiC substrate can be implemented in a single process.

Any method is adoptable for adjusting the inert gas. An appropriate method can be used. During the etching process, the inert gas pressure may be kept constant or may be varied. Varying the inert gas pressure may be employed in a case of, for example, initially setting the rate of etching high and then lowering the rate of etching for fine adjustment.

The environment of the treatment, the single crystal SiC substrate used, and the like, are merely illustrative ones, and the present invention is applicable to various environments and various types of single crystal SiC substrates. For example, the heating temperature is not limited to the temperature illustrated above, and a lower heating temperature enables further lowering of the rate of etching. Moreover, a heating apparatus other than the above-described high-temperature vacuum furnace is adoptable.

DESCRIPTION OF THE REFERENCE NUMERALS 10 high-temperature vacuum furnace
21 main heating chamber 22 preheating chamber
30 crucible
40 single crystal SiC substrate
41 epitaxial layer
42 ion-implanted portion

The invention claimed is:

1. A method for treating a surface of a single crystal SiC substrate, comprising
an ion implanting step of implanting ions in the single crystal substrate,
etching the single crystal SiC substrate by heat treatment under Si vapor pressure and controlling the rate of etching by adjusting inert gas pressure of an atmosphere around the single crystal SiC substrate,
wherein the rate of etching is 1000 nm/min or less, and
wherein in the etching step about several tens of nm from the surface of an insufficient ion-implanted portion of the single crystal SiC substrate having an insufficient ion concentration of implanted ions is removed.

2. The method for treating the surface of the single crystal SiC substrate according to claim 1, wherein
the single crystal SiC substrate is treated in a crucible-made of tantalum metal, and
a tantalum carbide layer is exposed to an internal space of the crucible.

3. The method for treating the surface of the single crystal SiC substrate according to claim 1, wherein
in the etching step, the ions implanted in the single crystal SiC substrate are activated while the insufficient ion-implanted protion is removed.

4. The method for treating the surface of the single crystal SiC substrate according to claim 1, wherein
the etching step is performed on the single crystal SiC substrate whose surface is exposed without being covered with any carbon layer.

5. The method for treating the surface of the single crystal SiC substrate according to claim 1, wherein
the rate of etching is 100 nm/min or less.

6. The surface treatment method for treating the surface of the single crystal SiC substrate according to claim 1, wherein
the etching step is performed on the single crystal SiC substrate before an epitaxial layer is formed thereon.

7. The method for treating the surface of the single crystal SiC substrate according to claim 1, wherein
the inert gas pressure is 10 Pa or more.

8. A method for treating a surface of a single crystal SiC substrate, in which the single crystal SiC substrate is etched by performing a heat treatment under Si vapor pressure, the method comprising
an etching step of controlling the rate of etching by adjusting inert gas pressure of an atmosphere around the single crystal SiC substrate, wherein
the single crystal SiC substrate has an off angle relative to a (0001) face,
wherein in the etching step, the heat treatment is performed on the single crystal SiC substrate in an atmosphere of an inert gas and Si, to remove macro-step bunching during the treatment performed on the surface of the single crystal SiC substrate and about several tens of nm from the surface of an insufficient ion-implanted portion of the surface of the single crystal SiC substrate having an insufficient ion concentration of implanted ions is removed.

9. The method for treating the surface of the single crystal SiC substrate according to claim 8, wherein
the inert gas pressure is adjusted so as to set the rate of etching to 100 nm/min or more.

10. The method for treating the surface of the single crystal SiC substrate according to claim 8, wherein
the inert gas pressure is adjusted so as to set the rate of etching to 1000 nm/min or less.

11. The method for treating the surface of the single crystal SiC substrate according to claim 8, wherein
the inert gas pressure at a time of removal of the macro-step bunching is, at least temporarily, set to 0.5 Pa or more and 10 Pa or less.

12. The method for treating the surface of the single crystal SiC substrate according to claim 8, wherein
an insufficient ion-implanted portion of the surface of the single crystal SiC substrate and the macro-step bunching are removed simultaneously.

* * * * *